United States Patent
Ramos et al.

[19]

[11] Patent Number: 6,139,640
[45] Date of Patent: Oct. 31, 2000

[54] CHEMICAL VAPOR DEPOSITION SYSTEM AND METHOD EMPLOYING A MASS FLOW CONTROLLER

[75] Inventors: Jesse C. Ramos, Austin; Charles B. Silman, San Marcos, both of Tex.

[73] Assignee: Advanced Micro Devices, Inc., Sunnyvale, Calif.

[21] Appl. No.: 09/132,723

[22] Filed: Aug. 12, 1998

[51] Int. Cl.[7] .................................................. C23C 16/00
[52] U.S. Cl. ............................................................ 118/715
[58] Field of Search ............................................ 118/715

[56] References Cited

U.S. PATENT DOCUMENTS

| | | | |
|---|---|---|---|
| 4,910,042 | 3/1990 | Hokynar | 118/715 |
| 5,462,603 | 10/1995 | Murakami | 118/719 |

FOREIGN PATENT DOCUMENTS

| | | | |
|---|---|---|---|
| 60-149120 | 8/1985 | Japan | 118/723 R |
| 64-28361 | 1/1989 | Japan | 118/723 E |
| 2-107775 | 4/1990 | Japan | 118/715 |
| 2-170981 | 7/1990 | Japan . | |
| 63-238281 | 10/1998 | Japan | 118/715 |

OTHER PUBLICATIONS

Wolf, et al., "Silicon Processing for the VLSI Era, vol. 1: Process Technology," Lattice Press 1986, pp. 161–234.

*Primary Examiner*—Richard Bueker
*Attorney, Agent, or Firm*—Kevin L. Daffer; Conley, Rose & Tayon

[57] ABSTRACT

An LPCVD system is provided in which a mass flow controller is used to control the flow rate of gases passing from a reaction chamber to a vacuum pump. The mass flow controller is disposed within a secondary outlet conduit which connects a first point to a second point of a primary outlet conduit. The primary outlet conduit extends between and in gaseous communication with the reaction chamber and the vacuum pump. The secondary outlet conduit permits gases flowing from the reaction chamber to bypass a primary valve disposed within the outlet conduit downstream of the first point and upstream of the second point. The mass flow controller can advantageously maintain the flow rate of the gases at a setpoint value for a period of time before the flow rate begins to drop. As such, the mass flow controller provides for a reduction in the time required to evacuate the vacuum chamber.

11 Claims, 9 Drawing Sheets

CHEMICAL VAPOR DEPOSITION SYSTEM AND METHOD EMPLOYING A MASS FLOW CONTROLLER

BACKGROUND OF THE INVENTION

1. Field of the Invention

This invention relates to integrated circuit fabrication and, more particularly, to a chemical vapor deposition system and method employing a mass flow controller through which cases flow from a reaction chamber to a vacuum pump, wherein the mass flow controller provides for a decrease in the time period required to evacuate the reaction chamber.

2. Description of the Related Art

Chemical vapor deposition ("CVD") is a well-known process employed during the fabrication of an integrated circuit to deposit a thin film upon a substrate. A CVD process involves introducing reactive gases, for example, silane and oxygen into a reaction chamber. Various inert carrier gases, such as hydrogen may be used to carry the reactive gases into the chamber. Reactive species within the gases adsorb onto the topological surface of a substrate which has been placed in the reaction chamber. Those adsorbed reactive species then undergo migration and reaction to form an inorganic layer across the topological surface. The gaseous by-products of the reaction are desorbed and removed from the reaction chamber, along with the unconsumed reactant gases, and the inert carrier gases.

The CVD process can take place in either pressurized or non-pressurized reaction chambers. Due to the stringent requirements of film uniformity, low pressure chemical vapor deposition ("LPCVD") reactors have gained in popularity. LPCVD reactors generally operate in the pressure range of 0.1 to 10 Torr and the temperature range of 500 to 600° C. Reducing the pressure of the reactor allows the diffusivity of the reactant gas molecules to increase to an amount sufficient to eliminate mass-transfer constraints on the deposition rate. Further, low pressure operation of the reactor affords decreased gas phase reactions. As such, high quality films having relatively few impurities or contaminants can be formed upon a substrate using LPCVD.

A vacuum system is typically used to evacuate the LPCVD reaction chamber prior to introducing the reactant gases into the chamber. FIG. 1 illustrates a side view of a portion of an exemplary LPCVD system, deemed Alpha 858S which is commercially available from Tokyo Electronics Limited Co. The LPCVD system includes a reaction chamber 10, a primary outlet conduit 12, and a secondary outlet conduit 16 which are all in gaseous communication with each other. Primary outlet conduit 12 connects reaction chamber 10 to a vacuum pump. A primary valve 14 is positioned within primary outlet conduit 12 for controlling the flow of gases through primary outlet conduit 12. A secondary outlet conduit 16 is connected to a first point 32 of primary outlet conduit 12 located upstream of primary valve 14. The diameter of secondary outlet conduit 16 is substantially smaller than that of primary outlet conduit 12. As secondary outlet conduit 16 passes away from that first point of primary outlet conduit 12, it diverges into lines 18 and 20. Line 18 extends to a second point 34 of primary outlet conduit 12 located downstream of primary valve 14 while line 20 exhausts gas from the LPCVD system. A secondary isolation valve 22 and a manually adjustable needle valve 24 are disposed within line 18. The LPCVD system also includes a cold trap 26 for condensing species within the gases passing therethrough that could be corrosive and hazardous to, e.g., parts of the vacuum pump system.

Evacuation of reaction chamber 10 involves a slow pump step and a fast pump step. The slow pump step is used to reduce the pressure within reaction chamber 10 from atmospheric pressure (760 Torr) to about 1 Torr (i.e., the "crossover" point). In the slow pump step, primary isolation valve 14 is closed and secondary isolation valve 22 is opened. Thus, gases are drawn from reaction chamber 10 to the vacuum pump through secondary conduit 16 and line 18 without passing through primary valve 14. Once the crossover point has been reached, primary valve 14 is opened to permit the gases to pass through the main section of primary conduit 12 to the vacuum pump. In this manner, the fast pump step is performed to reduce the pressure within reaction chamber 10 from 1 Torr to about 1 to 10 milliTorr. The slow pump step allows a regime of vacuum at the crossover point to be achieved within reaction chamber 10 without causing high turbulence in the flow of the gases. Opening primary valve 14 when the pressure within reaction chamber 10 is about 1 Torr is less likely to cause the outer shell (e.g., a quartz tube) of reaction chamber 10 to fracture. Otherwise, if primary valve 14 is opened when reaction chamber 10 is at atmospheric pressure, the outer shell of reaction chamber 10 might implode from the large amount of suction generated. The relatively large opening (e.g., 4 inches) inside the valve in combination with the great pressure differential would cause the gases to flow from reaction chamber 10 at a relatively high rate.

Needle valve 24 is initially manually adjusted to partially restrict the flow of the gases passing through line 18 during the slow pump step. Since needle valve 24 is manually adjusted, its initial setting unfortunately may be inconsistent from one LPCVD maintenance procedure to the next. The setting of needle valve 24 is chosen to allow reaction chamber 10 to be pumped down to the crossover point as quickly as possible without introducing an excessive amount of particles into the gases exiting reaction chamber 10. Such particles may comprise the products (e.g., silicon nitride, silicon dioxide, and polycrystalline silicon) and the by-products of the LPCVD reactions. The inner wall of reaction chamber 10 may become coated with the products and the by-products over time. Due to the initial impact on the shell of reaction chamber 10 when secondary isolation valve 22 is opened, some of the products and the by-products accumulated thereon may fall into the gas stream as particles. Those particles can contaminate and damage semiconductor topographies during subsequent processing steps, rendering ensuing integrated circuits inoperable.

As the slow pump step progresses, the pressure differential between reaction chamber 10 and the vacuum pump decreases and the flow rate through needle valve 24 decreases. Unfortunately, the initial setting of needle valve 24 can only be changed manually, and thus remains fixed unless a person continuously monitors and adjusts it. The cost of reserving someone for only the operation of needle valve 24 is typically not feasible to the integrated circuit manufacturer. Absent continuous adjustment of needle valve 24, the flow rate of the gases passing therethrough will drop rapidly, increasing the time period required to reach the crossover point. Consequently, the amount of time required to deposit a film onto a substrate using LPCVD is increased. Therefore, using needle valve 24 to control the flow of the gases through line 18 undesirably limits the level of throughput that can be achieved by the integrated circuit manufacturer. The throughput may be increased at the risk of introducing more particle defects to the integrated circuits being fabricated. That is, the initial setting of needle valve 24 may be adjusted to provide for a greater initial flow rate of the gases through the needle valve. However, the additional pressure shock to reaction chamber 10 may result in a significant increase in the amount of particles entering the gases within the chamber.

It would therefore be of benefit to develop a technique for strictly controlling the flow rate of gases through the secondary outlet conduit of the LPCVD system. In particular, a constant flow rate must be maintained within the secondary outlet conduit so that the crossover point may be reached more quickly. In other words, the amount of time required for the slow pump step must be reduced to increase the throughput of the manufacturer. Accordingly, it would be desirable to replace the manually adjustable needle valve with a valve that could automatically control the flow rate without requiring constant readjustment by a person. In addition, the initial flow rate of the gases passing through the secondary outlet conduit must be minimized to lower the number of particles entering into the gas stream.

SUMMARY OF THE INVENTION

The problems outlined above are in large part solved by the LPCVD system hereof in which a mass flow controller is used to control the flow rate of gases passing from a reaction chamber to a vacuum pump. The mass flow controller is disposed within a secondary outlet conduit which connects a first point to a second point of a primary outlet conduit. The primary outlet conduit extends between and in gaseous communication with the reaction chamber and the vacuum pump. The secondary outlet conduit permits gases flowing from the reaction chamber to bypass a primary valve disposed within the outlet conduit downstream of the first point and upstream of the second point.

According to an embodiment, the secondary outlet conduit separates into first and second lines. The first line serves to exhaust gases passing therethrough to the atmosphere, and the second line extends to the second point of the primary outlet conduit. The second line is therefore used to deliver gases to the second point of the primary outlet conduit. The mass flow controller is disposed within the second line for controlling the flow of gases through the second line. A secondary isolation valve is located upstream of the mass flow controller. The secondary isolation valve may be opened to permit gases to flow through the mass flow controller or closed to block the flow of gases through the mass flow controller. A computer control system may be used to automatically control the mass flow controller based on the flow rate of the gases passing through the mass flow controller.

In preparation for the deposition of a film across a substrate, the gases within the LPCVD reaction chamber are removed to reduce the pressure of the chamber. First, a slow pump step is performed in which the primary valve within the primary outlet conduit is closed while the vacuum pump is being operated. The secondary isolation valve is opened to allow the gases to be slowly drawn through the mass flow controller from the reaction chamber by the vacuum pump. The mass flow controller includes both a valve and a mass flowmeter. The mass flow controller is preferably a thermal type controller which uses a temperature differential to determine the flow rate of the gases. Initially, the mass flow controller maintains the flow rate of the gases passing therethrough at the setpoint value. As the pressure within the reaction chamber decreases, the pressure differential between the reaction chamber and the vacuum pump also drops. Thus, the flow rate of the gases passing through the mass flow controller begins to decrease, and thereby "starves" the mass flow controller. However, the computer control system detects this drop in the flow rate and automatically increases the inner diameter of the mass flow controller in an attempt to maintain the flow rate at the setpoint value.

The mass flow controller may be heated to inhibit LPCVD by-products, eg.,a ammonium chloride (produced during deposition of silicon nitride), from depositing upon the surfaces of the controller. Absent an isolation valve downstream of the mass flow controller, such by-products are also drawn away from the mass flow controller. Preventing by-products from building up inside the mass flow controller is necessary to maximize the life of the controller.

Advantageously, the mass flow controller is automatically adjusted without consuming a large portion of a person's valuable time. Further, since the inner diameter of the mass flow controller is not fixed in its initial position, better control of the flow rate of the gases is achieved. Therefore, the flow rate of the gases passing through the mass flow controller may be maintained at the setpoint value for a longer period of time. Consequently, a shorter period of time is required to reduce the pressure of the reaction chamber to a desired amount. As such, a lower setpoint value for the flow rate may be used without significantly increasing the time required for the slow pump step of the LPCVD process. Reducing the amount of time needed for the LPCVD process affords increased throughput of the final product for the integrated circuit manufacturer. Also, since the initial flow rate of the gases passing from the reaction chamber is reduced, less contaminating particles enter the gas stream within the reaction chamber. That is, at a lower flow rate, the reaction chamber experiences less vibrations that could cause particles to fall from its inner wall into the gas stream leaving the chamber.

As a result of the slow pump process, the pressure within the reaction chamber is reduced to a value at which the primary valve may be opened without damaging the reaction chamber. Once this crossover point has been reached, the primary valve is opened to allow the gases to be pumped through the primary outlet conduit to the vacuum pump. In this manner, the pressure within the reaction chamber is reduced to about 1 to 10 milliTorr so that the LPCVD deposition may be performed.

BRIEF DESCRIPTION OF THE DRAWINGS

Further advantages of the present invention will become apparent to those skilled in the art upon reading the following description of the preferred embodiments and upon reference to the accompanying drawings in which.

Figure 1:
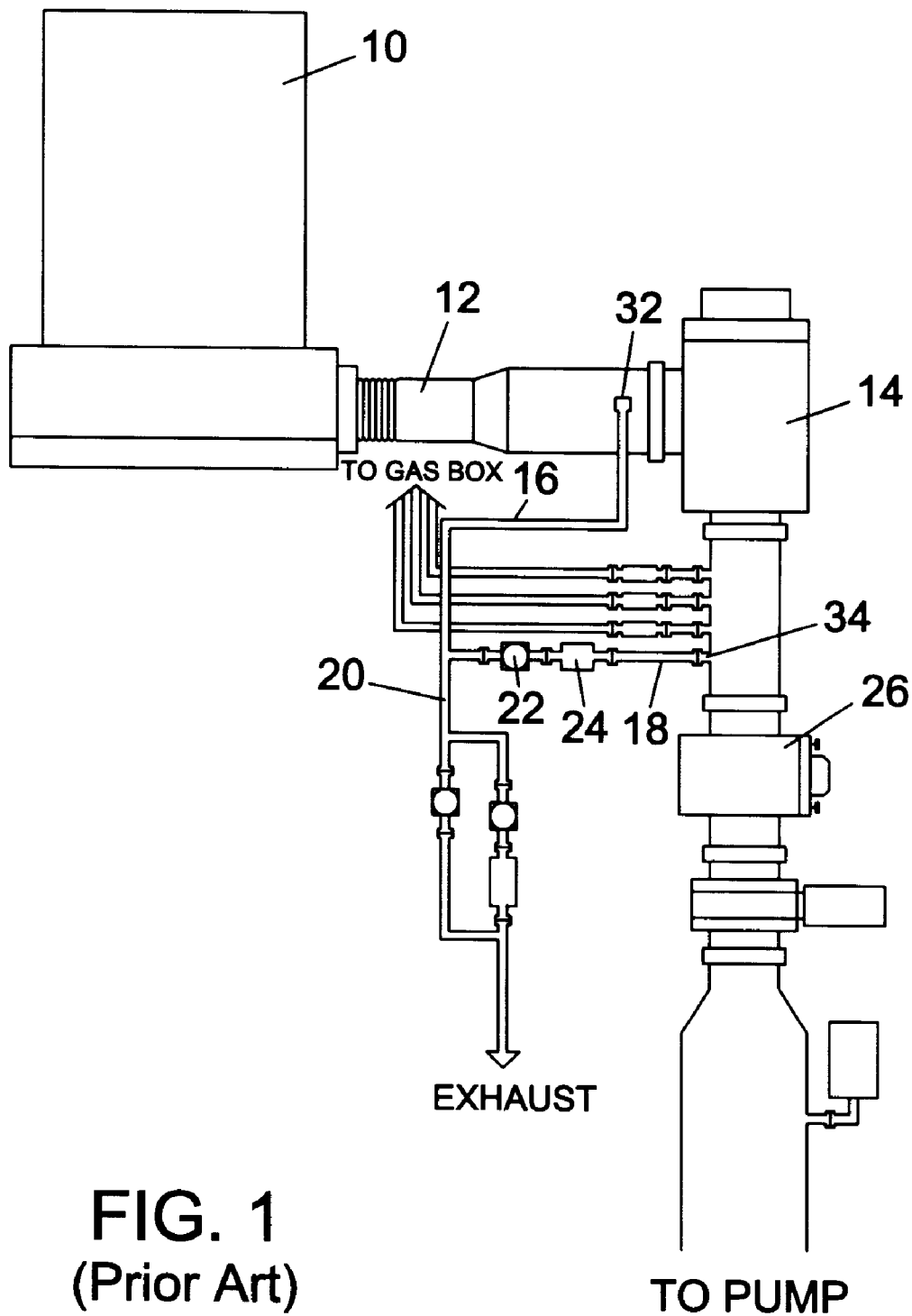
FIG. 1 is a side view of a portion of a conventional LPCVD system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
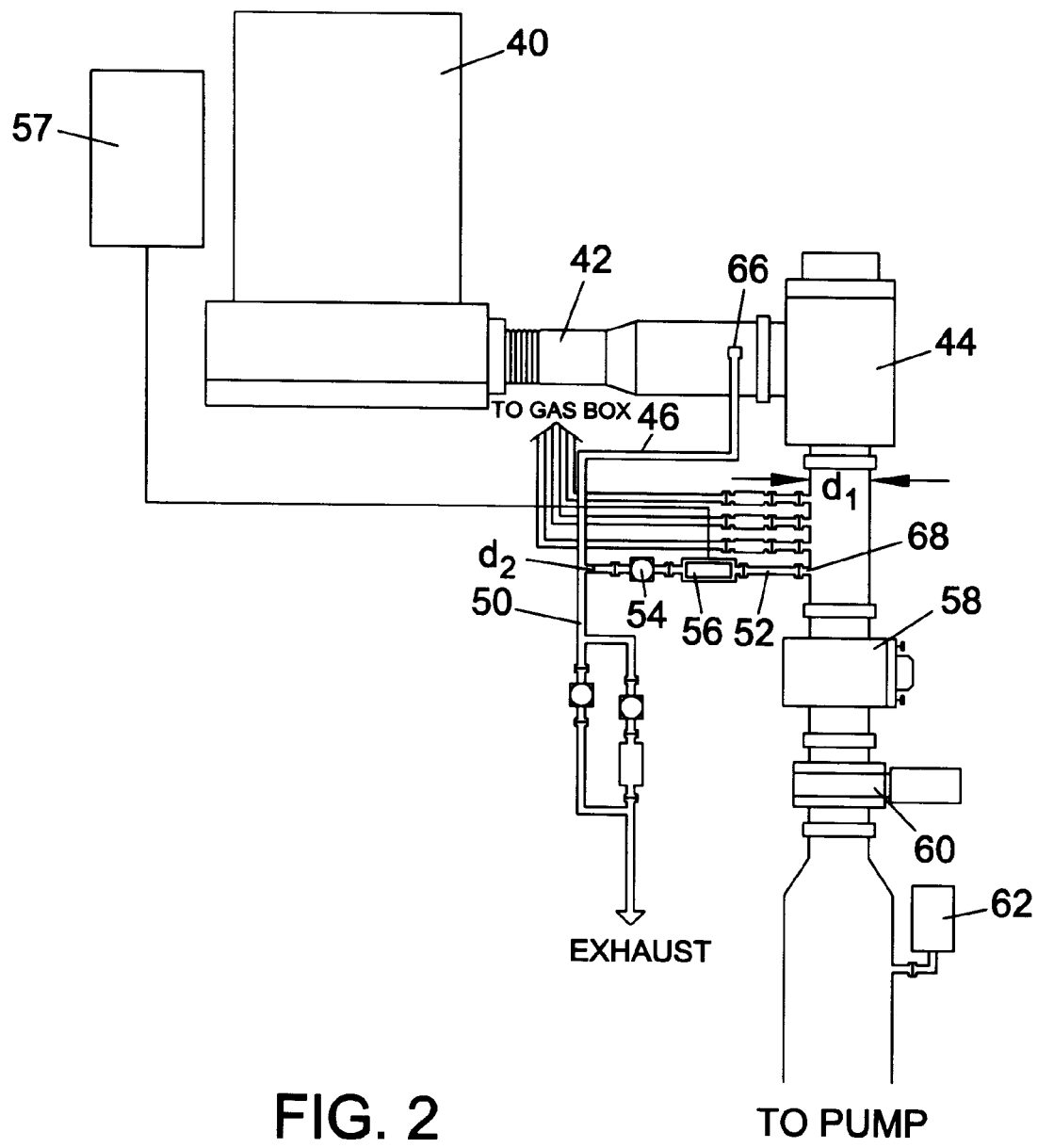
FIG. 2 is a side plan view of a portion of an LPCVD system according to one embodiment of the present invention, wherein a mass flow controller is disposed within a secondary outlet conduit which extends between a first point and a second point of a primary outlet conduit connected to a reaction chamber, and wherein the second point is located upstream of a cold trap.

Turning now to FIG. 2, the evacuation portion of an LPCVD system according to an embodiment of the present invention is depicted. The LPCVD system includes a reaction chamber 40 in which a material (e.g., silicon nitride, tetraethyl orthosilicate (TEOS), and polycrystalline silicon) may be deposited onto a substrate. Reaction chamber 40 may include a cylindrical quartz housing. Although not shown, inlet conduits through which reactive and inert gasses pass into reaction chamber 40 are connected to the housing. A platform may be disposed within reaction chamber 40 for holding a semiconductor wafer. A primary outlet conduit 42 which is in gaseous communication with reaction chamber 40 connects the reaction chamber to a vacuum pump. The vacuum pump may be used to draw gases from reaction chamber 40 in order to reduce the pressure within the chamber.

A primary valve 44 is disposed within primary outlet conduit 42 for controlling the flow of gases through the primary outlet conduit. Primary valve 44 is an isolation valve in that it may be opened to permit the flow of gases therethrough and closed to prevent the flow of gases therethrough. Primary valve 44 may, e.g., comprise an air-operated gate valve. A secondary outlet conduit 46 which is in gaseous communication with primary outlet conduit 42 extends between a first point 66 and a second point 68 of primary outlet conduit 42. Primary outlet conduit 42 and secondary outlet conduit 46 are preferably pipes composed of, e.g., 316 stainless steel. The diameter, $d_1$, of primary outlet conduit 42 is substantially larger than the diameter, $d_2$, of secondary outlet conduit 46. For example, $d_1$ may be about 4 inches, and $d_2$ may be about ½ inch. Also, primary outlet conduit 42 may increase in diameter to about 6 inches as it approaches the vacuum pump to enhance the pumping.

As secondary outlet conduit 46 extends away from first point 66 of primary outlet conduit 42, it diverges into two lines 50 and 52. Line 50 may be used to exhaust gases from the LPCVD system. Line 52 terminates at second point 68 of primary outlet conduit 42. A mass flow controller 56 ("MFC") is disposed within line 52 for manipulating the flow rate of gases passing through line 52. An isolation valve 54 is disposed within line 52 upstream of mass flow controller 56. Isolation valve 54 may, e.g., comprise an air-operated gate valve which may be positioned in either a fully-opened position or a fully-closed position. A computer system 57 is connected to mass flow controller 56 for controlling the controller based on the measured flow rate of the gases passing through the controller. Although not shown, computer system 57 may also be connected to other devices belonging to the LPCVD system to control, e.g., the temperature within reaction chamber 40 and the type of gases supplied to reaction chamber 40.

An appropriate mass flow controller for a TEOS or a polycrystalline silicon deposition process is, e.g., a Brooks 5964 (model no.) thermal-type MFC, particularly the Brooks 5964C4MAV45KA (part no.), commercially available from Brooks Instrument in Hatfield, Pa. An appropriate mass flow controller for a silicon nitride deposition process is, e.g., an MKS M330H (model no.) thermal-type MFC, particularly the MKS M331A34CR1AM7 (part no.), commercially available from MKS Instruments in Boulder, Colo. Both types of mass flow controllers permit a maximum flow rate of 30 SLPM (standard liters per minute). The Brooks MFC may be used to heat the gases passing therethrough. As such, the gases may be heated to a temperature of about 150° C. to prevent a by-product of a silicon nitride deposition, i.e., ammonium chloride, from being deposited on the surfaces of mass flow controller 56. Absent the accumulation of ammonium chloride within mass flow controller 56, the life of the mass flow controller is thereby extended.

Figure 3:
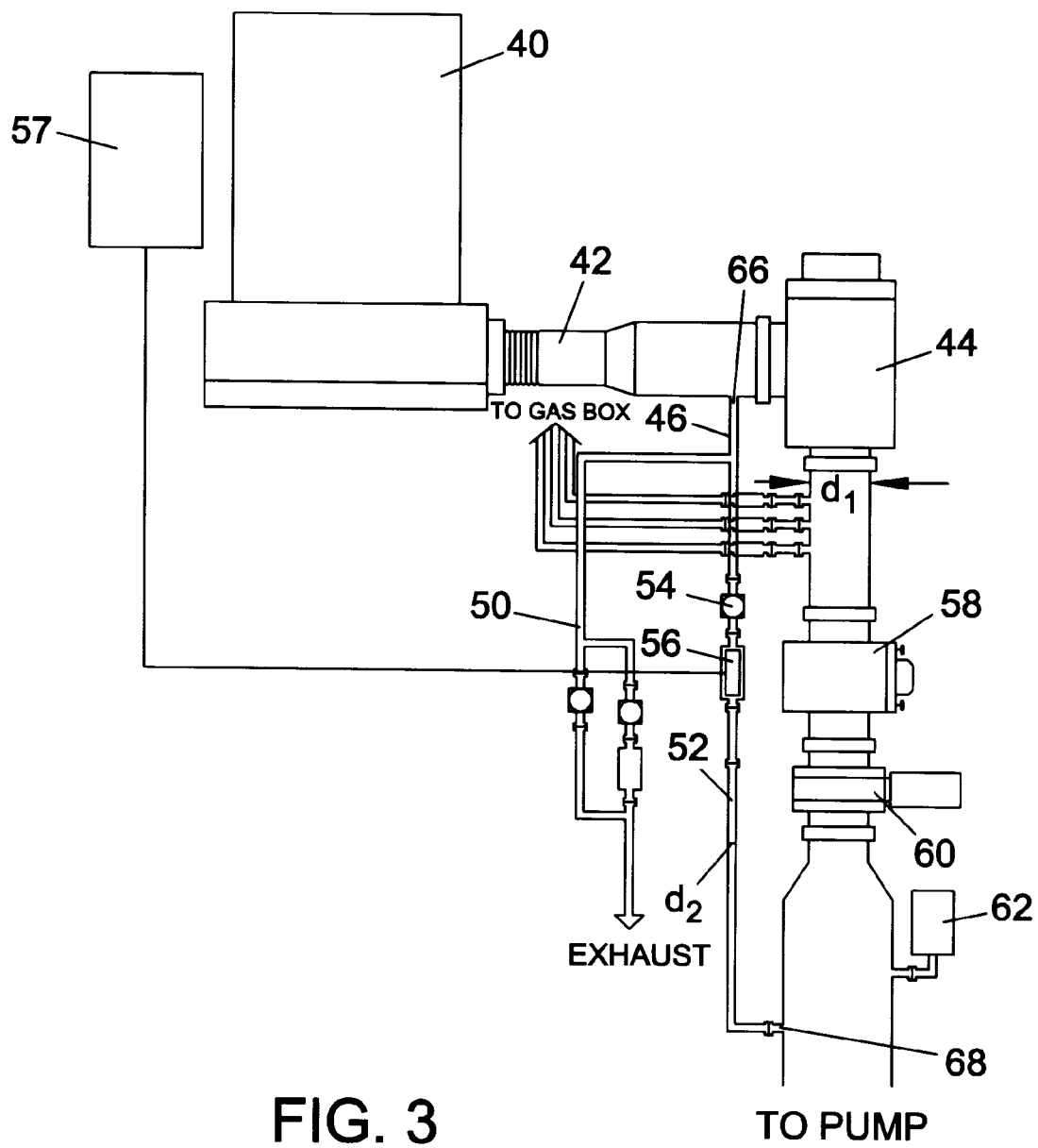
FIG. 3 is a side plan view of an LPCVD system according to another embodiment of the present invention, wherein a mass flow controller is disposed within a secondary outlet conduit which extends between a first point and a second point of a primary outlet conduit connected to a reaction chamber, and wherein the second point is located downstream of a cold trap.

The LPCVD system may also include a cold trap 58, an auto-pressure controller 60, and a pressure sensor 62. Cold trap 58 serves to condense species within the gases passing therethrough so that the liquid phase of those species may be trapped within a chamber of the cold trap. In this manner, species that could be harmful to the vacuum pump are inhibited from reaching the pump. Otherwise, species that could corrode metal components of the vacuum pump or react with oils of the pump could reduce the life of the pump. As shown in FIG. 2, point 68 of primary conduit 42 may be located upstream of cold trap 58. In a more preferred embodiment, as shown in FIG. 3, point 68 of primary conduit 42 may be located downstream of cold trap 58. Positioning point 68 downstream of cold trap 58 allows line 52 to be configured parallel to primary outlet conduit 42 for a majority of its length. As such, more space is available near line 52 to provide for easy access to mass flow controller 56 and isolation valve 54 when maintenance of these devices is required.

Figure 4:
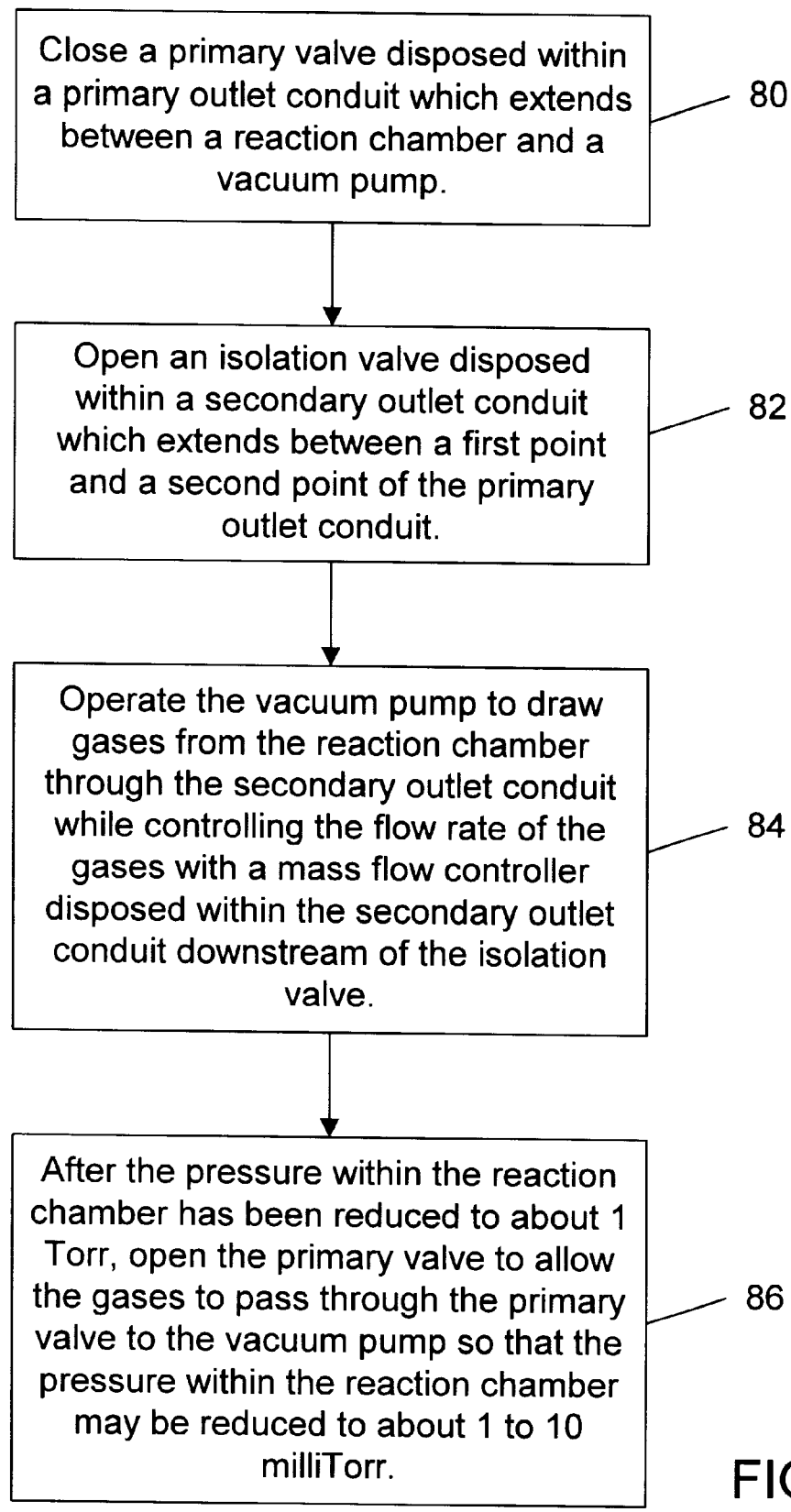
FIG. 4 depicts a process flow diagram for evacuating gases from the reaction chamber of the LPCVD system.

FIG. 4 depicts a process flow diagram for evacuating the gases within reaction chamber 40. As shown in block 80, primary valve 44 is first closed so that gases cannot pass through a main section of primary outlet conduit 42. As depicted in block 82, isolation valve 54 is then opened to permit gases to flow through line 52. As depicted in block 84, the vacuum pump is then operated to draw gases from reaction chamber 40 to the vacuum pump through secondary conduit 46. Thus, the gases bypass a section of primary outlet conduit interposed between point 66 and point 68. As the gases are being pumped through secondary conduit 46, computer system 57 controls mass flow controller 56. As the flow rate through the mass flow controller 56 begins to decrease due to a drop in the pressure differential between reaction chamber 40 and the vacuum pump, computer system 57 causes the controller to open more. As such, mass flow controller 56 may be able to maintain the flow rate of the gases passing therethrough at the setpoint value for a period of time. As shown in block 86, once the pressure within reaction chamber 40 has been reduced to, e.g., 1 Torr, primary valve 44 is opened to allow the gases to pass through the main section of primary outlet conduit 42. The gases are then pumped from reaction chamber 40 for the time period required to reduce the pressure within the chamber to about 1 to 10 milliTorr.

EXAMPLE

A TEL Alpha 858S LPCVD system was used to determine the time required to reduce the pressure within the reaction chamber to 1 Torr (i.e., time duration of slow pump step) using a conventional LPCVD system. FIG. 1 depicts the evacuation portion of the Alpha 858S system. First, primary valve 14 was closed, isolation valve 22 was opened, and needle valve 24 was manually adjusted to an initial setting. The initial setting of needle valve 24 was chosen so that 20 minutes would be required to reduce the pressure within reaction chamber 10 from atmospheric pressure to 20 Torr. The vacuum pump was then operated to draw the gases from reaction chamber 10 to the pump. A flow meter had been placed within reaction chamber 10 prior to performing the slow pump step. The flow rate through needle valve 24 was determined by injecting $N_2$ gas into reaction chamber 10 and adjusting the flow rate of the gas until the pressure within reaction chamber 10 could be maintained at 1 atmosphere. The flow rate of the $N_2$ gas that successfully maintained reaction chamber 10 at atmospheric pressure was determined to be the flow rate of the gases leaving the reaction chamber. This flow rate was determined to be about 10,300 sccm. Injection of the $N_2$ gas into reaction chamber 10 was then terminated. After reaction chamber 10 had been pumped down to about 1 Torr, primary valve 14 was opened to permit the gases to flow through the main section of primary outlet conduit 12. Eventually, reaction chamber 10 reached approximately 1 to 10 milliTorr.

Figure 5:
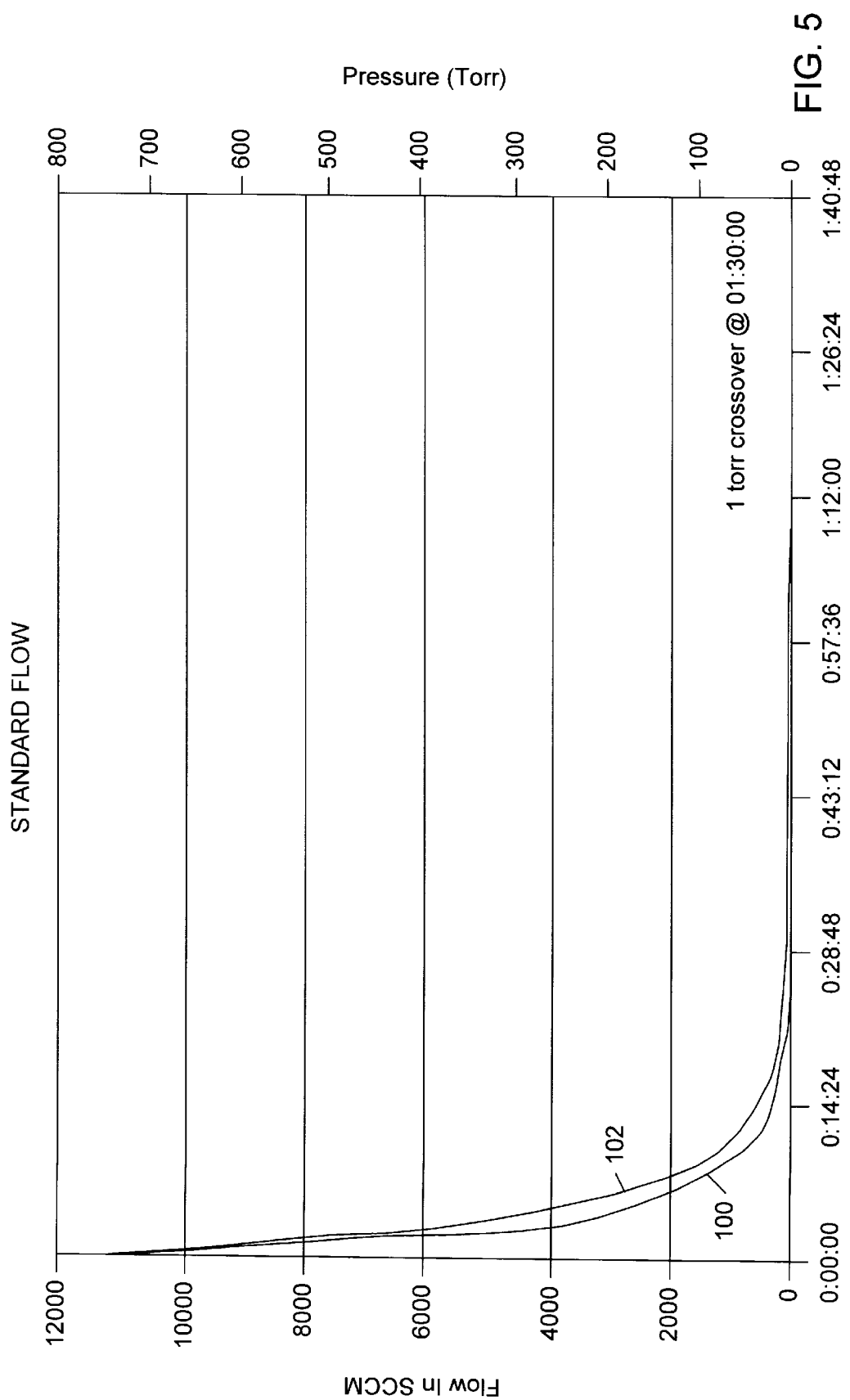
FIG. 5 depicts a plot of the flow rate of gases passing through a needle valve of a conventional LPCVD system as a function of time and a plot of the pressure within the reaction chamber as a function of the time, wherein the initial flow rate of the gases is 10,250 sccm.

FIG. 5 depicts a plot 100 of the flow rate versus time and a plot 102 of the chamber pressure versus time for the slow pump step in which the flow rate was controlled by needle valve 24. The flow rate of the gases constantly decreased as the pressure within reaction chamber 10 decreased. Needle valve 24 could not maintain the flow rate at 10,300 sccm for even a short period of time. Thus, it took approximately 1 hour and 30 minutes for the pressure within reaction chamber 10 to reach the crossover point of 1 Torr.

An LPCVD system in which the evacuation portion is the same as the one depicted in FIG. 3 was prepared by reconfiguring the secondary outlet conduit of a TEL Alpha 858S LPCVD system. The manually operated needle valve of the TEL Alpha 858S was replaced with the Brooks 5964C4MAV45KA mass flow controller. The Alpha 858S already has the ability to control mass flow controllers. Accordingly, the computer system used by the LPCVD system was connected to mass flow controller 56. Therefore, the same computer system could be used to set the process parameters for the LPCVD system and to control mass flow controller 56. The pressure within reaction chamber 40 was reduced as described above. The setpoint value for the flow rate of the gases was 10,300 sccm. This procedure was repeated for setpoint values of 5,000 sccm and 2,000 sccm.

Figure 6:
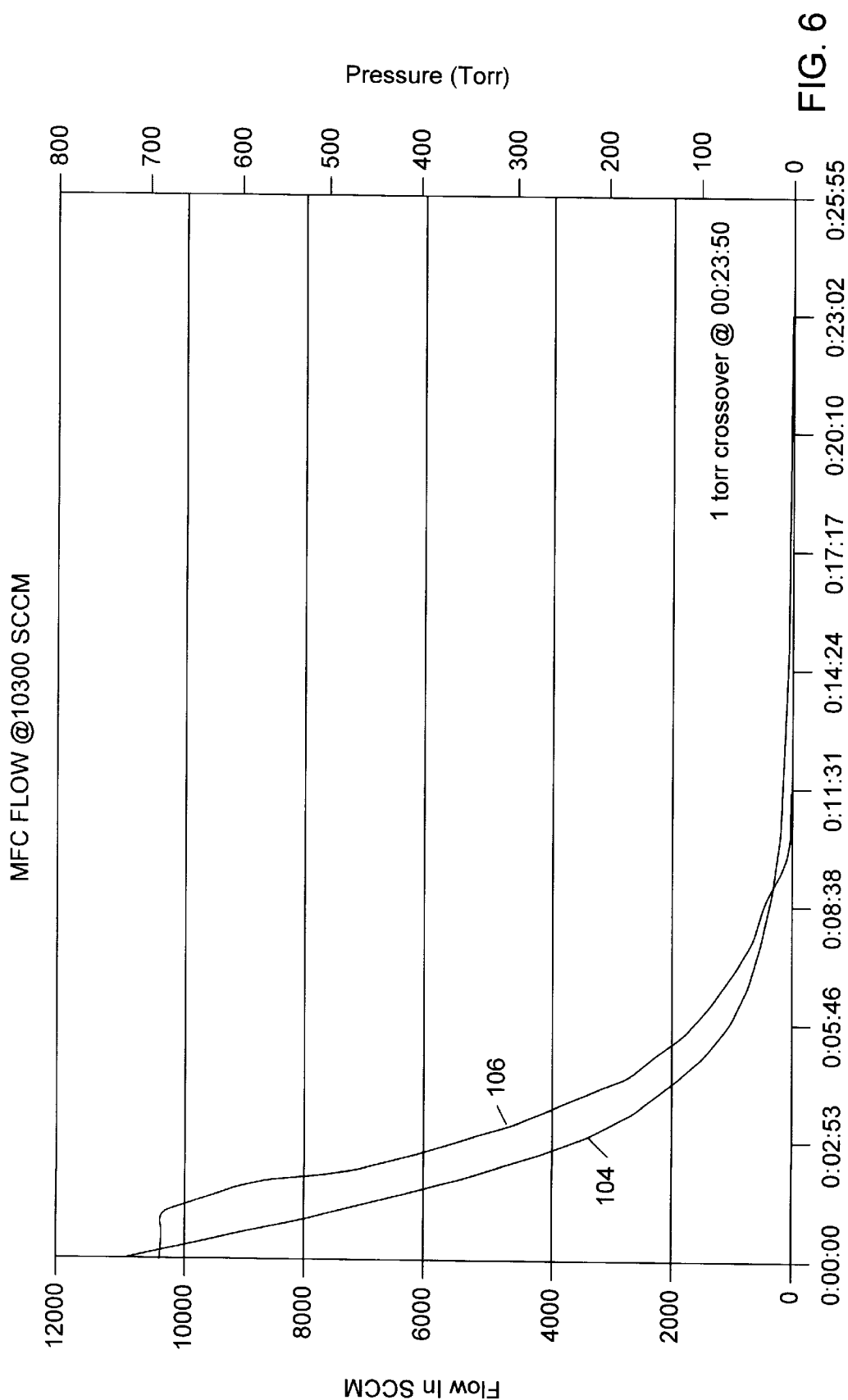
FIG. 6 depicts a plot of the flow rate of gases passing through a mass flow controller of an LPCVD system as a function of time and a plot of the pressure within the reaction chamber as a function of time, wherein the setpoint of the mass flow controller is 10,300 sccm.
Figure 7:
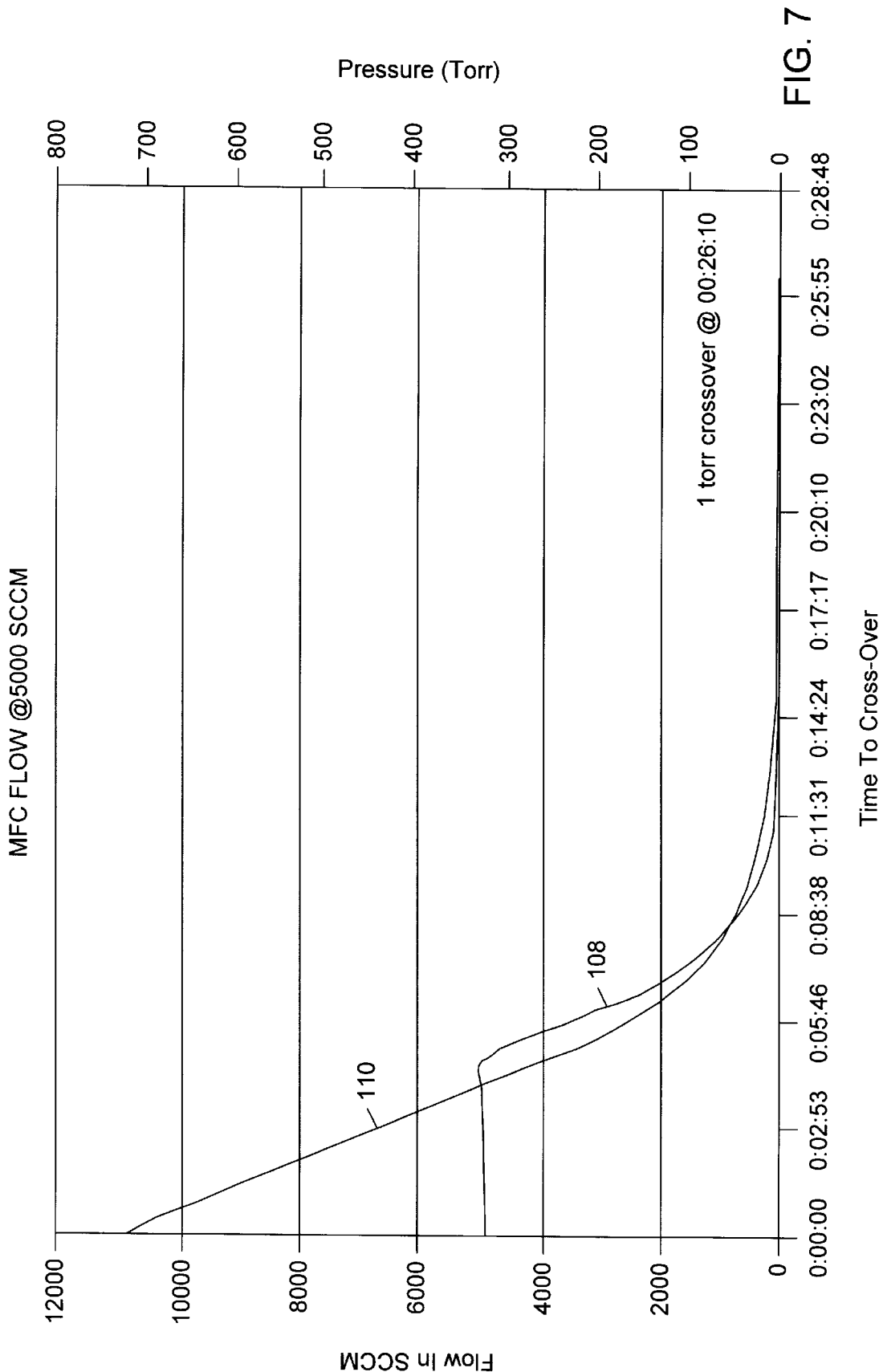
FIG. 7 depicts a plot of the flow rate of gases passing through a mass flow controller of an LPCVD system as a function of time and a plot of the pressure within the reaction chamber as a function of time, wherein the setpoint of the mass flow controller is 5,000 sccm.
Figure 8:
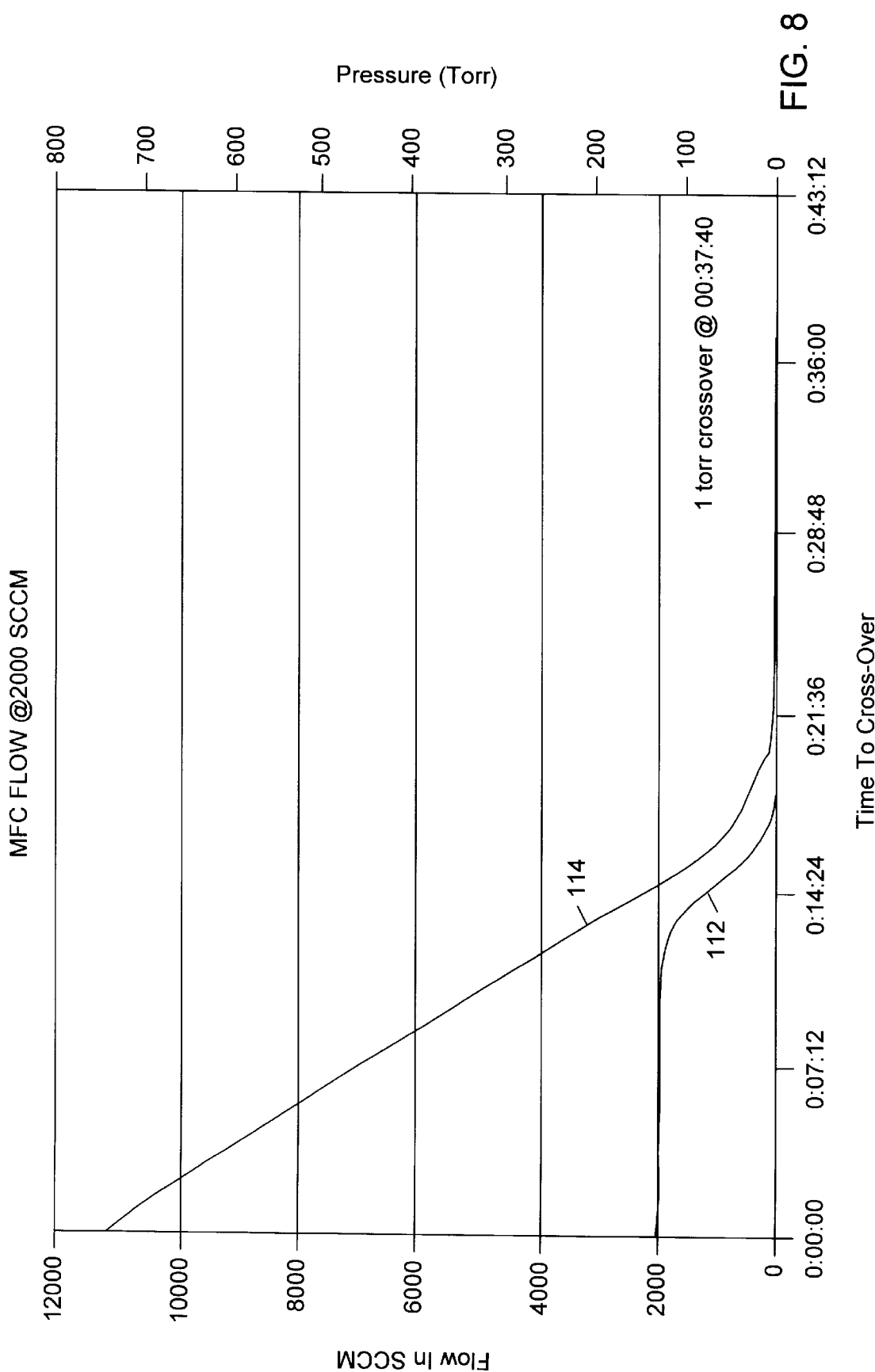
FIG. 8 depicts a plot of the flow rate of gases passing through a mass flow controller of an LPCVD system as a function of time and a plot of the pressure within the reaction chamber as a function of time, wherein the setpoint of the mass flow controller is 2,000 sccm.

FIG. 6 illustrates a plot 104 of the flow rate versus time and a plot 106 of the chamber pressure versus time for the slow pump step in which a setpoint value of 10,300 sccm was used for mass flow controller 56. Mass flow controller 56 was able to maintain the flow rate of the gases at the setpoint value for a relatively short period of time before it began to drop. The pressure within reaction chamber 40 fell from atmospheric pressure to the crossover point of 1 Torr in just 23 minutes and 50 seconds. FIG. 7 depicts a plot 108 of the flow rate versus time and a plot 110 of the chamber pressure versus time for the slow pump step in which a setpoint value of 5,000 sccm was used for mass flow controller 56. The flow rate of the gases was maintained at the setpoint value for a longer period time than when the setpoint value was 10,300 sccm. The pressure within reaction chamber 40 dropped from atmospheric pressure to the crossover point of 1 Torr in 26 minutes and 10 seconds. FIG. 8 depicts a plot 112 of the flow rate versus time and a plot 114 of the chamber pressure versus time for the slow pump step in which a setpoint value of 2,000 sccm was used for mass flow controller 56. In this case, mass flow controller 56 maintained the flow rate at the setpoint value for a longer period of time than in the instance when the setpoint value was 5,000 sccm. The pressure within reaction chamber 40 decreased from atmospheric pressure to the crossover point of 1 Torr in 37 minutes and 40 seconds.

Figure 9:
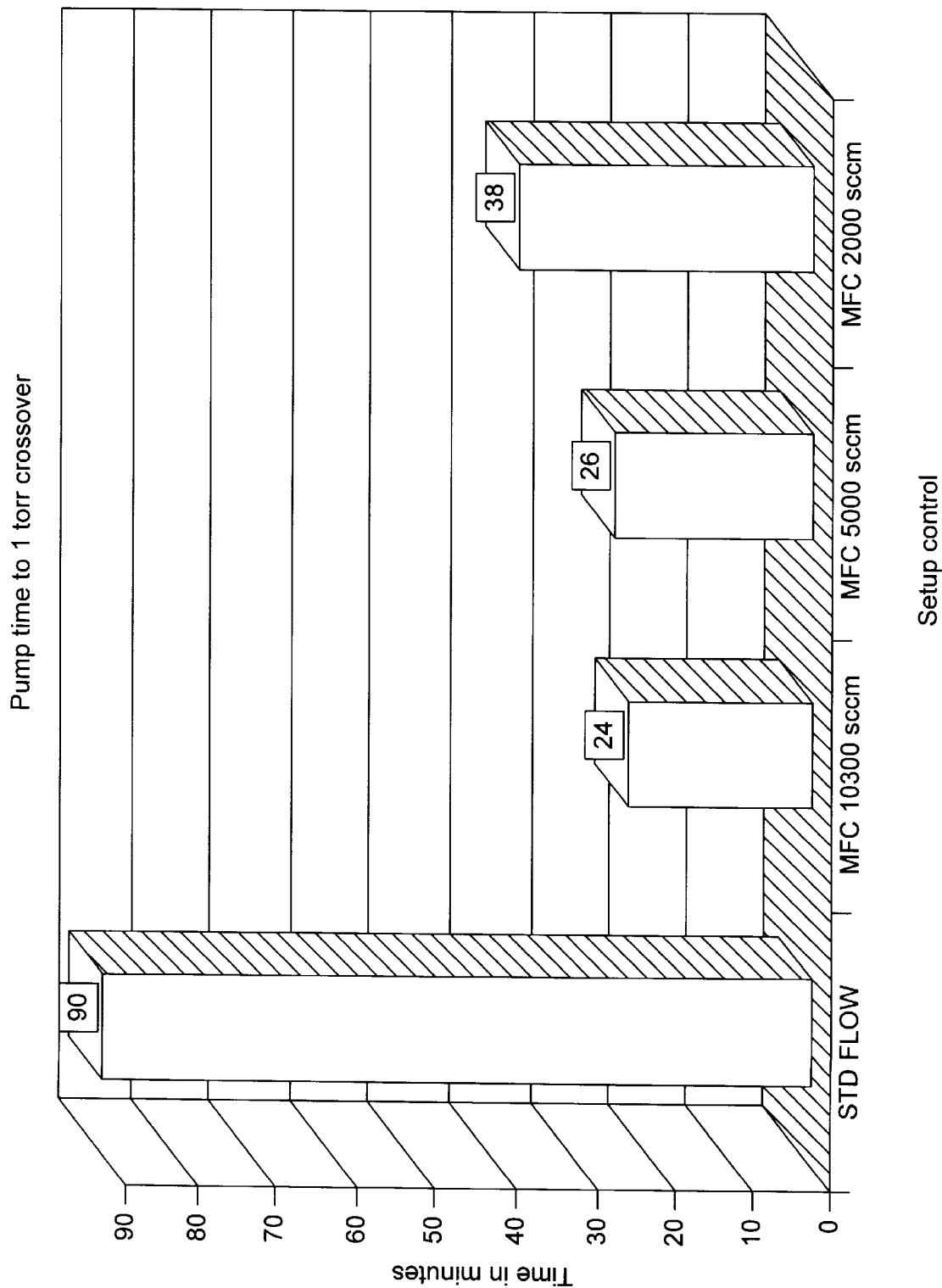
FIG. 9 depicts a bar graph of the time required to reduce the pressure within the reaction chamber to 1 Torr using different process parameters.

Turning to FIG. 9, a bar graph of the time required to reduce the pressure within the reaction chamber to 1 Torr using different process parameters is shown. A conventional LPCVD slow pump step in which the needle valve was initially set for a flow rate of 10,300 sccm took about 90 minutes to perform. Replacing the needle valve with a mass flow controller reduced the slow pump step time significantly. At a setpoint of 10,300 sccm, the amount of time required by the slow pump step employing the needle valve was only about 24 minutes. As the setpoint was decreased to 5,000 sccm, the time duration of the slow pump step rose slightly to about 26 minutes. Further, reducing the setpoint to 2,000 sccm resulted in an increase in the time duration of the slow pump step to about 38 minutes.

Using a mass flow controller rather than a needle valve to control the flow rate of the slow pump step thus significantly reduces the amount of time (by about 1 hour) required to lower the pressure within the reaction chamber to 1 Torr. However, decreasing the setpoint value used for the mass flow controller only leads to a slight increase in the time required by the slow pump step. Decreasing the setpoint appears to lead to a drop in the number of particle defects that accumulate upon a semiconductor substrate as a result of evacuating gases from the reaction chamber. That is, at a lower flow rate, the reaction chamber experiences less vibrations which might cause particles to fall from the chamber wall into the gas stream. Therefore, decreasing the setpoint value to as low as 2,000 sccm both reduces the time required for the slow point step and decreases the number of contaminating particles entering into the gas stream.

It will be appreciated to those skilled in the art having the benefit of this disclosure that this invention is believed to provide a chemical vapor deposition system and method employing a mass flow controller through which gases flow from a reaction chamber to a vacuum pump, wherein the mass flow controller provides for a decrease in the time period required to evacuate the reaction chamber. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A system for performing a chemical vapor deposition process, comprising:

a reaction chamber;

a vacuum pump for drawing gas from the reaction chamber;

a primary outlet conduit extending between and in gaseous communication with the reaction chamber and the vacuum pump; and a secondary outlet conduit extending between a first point of the primary outlet conduit and a second point of the primary outlet conduit for permitting the gas to flow from the first point to the second point while bypassing a section of the primary outlet conduit; and a mass flow controller comprising a valve and a mass flowmeter, wherein the mass flow controller is disposed within the secondary outlet conduit for controlling movement of the gas through the secondary outlet conduit.

2. The system of claim 1, further comprising a primary valve disposed within the primary outlet conduit between the first point and the second point.

3. The system of claim 2, wherein the primary valve is adapted to control the movement of the gas through the primary outlet conduit.

4. The system of claim 1, further comprising an isolation valve disposed within the secondary outlet conduit upstream of the mass flow controller, wherein the first isolation valve is adapted to permit the gas to flow through the mass flow controller when open.

5. The system of claim 4, further comprising an isolation valve disposed within the secondary outlet conduit downstream of the mass flow controller, wherein the second isolation valve is adapted to inhibit the gas from flowing through the mass flow controller when closed.

6. The system of claim 1, wherein a first inner diameter of the primary outlet conduit is substantially larger than a second inner diameter of the secondary outlet conduit.

7. The system of claim 2, further comprising a cold trap disposed within the primary outlet conduit downstream of the primary valve for condensing species within the gas passing therethrough.

8. The system of claim 7, wherein the cold trap is located downstream of the second point.

9. The system of claim 7, wherein the cold trap is located upstream of the second point.

10. The system of claim 1, further comprising a computer system connected to the mass flow controller for controlling the mass flow controller.

11. The system of claim 1, wherein the mass flow controller is a thermal type mass flow controller.

* * * * *